(12) United States Patent
Baskaran

(10) Patent No.: US 7,902,617 B2
(45) Date of Patent: Mar. 8, 2011

(54) FORMING A THIN FILM ELECTRIC COOLER AND STRUCTURES FORMED THEREBY

(75) Inventor: Rajashree Baskaran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 295 days.

(21) Appl. No.: 12/148,316

(22) Filed: Apr. 18, 2008

(65) Prior Publication Data
US 2008/0230106 A1    Sep. 25, 2008

Related U.S. Application Data

(63) Continuation of application No. 11/296,959, filed on Dec. 7, 2005, now Pat. No. 7,833,816.

(51) Int. Cl.
*H01L 43/06* (2006.01)

(52) U.S. Cl. .............. 257/426; 257/930; 257/E27.008; 136/203

(58) Field of Classification Search ............ 136/203; 257/E27.008, 930, 426
See application file for complete search history.

(56) References Cited

U.S. PATENT DOCUMENTS 6,127,619 A * 10/2000 Xi et al. .............. 136/203

\* cited by examiner

*Primary Examiner* — Davienne Monbleau
*Assistant Examiner* — Matthew Reames
(74) *Attorney, Agent, or Firm* — Kathy J. Ortiz

(57) ABSTRACT

Methods of forming a microelectronic structure are described. Embodiments of those methods include forming a first plurality of openings through a first surface of a substrate, forming a p-type TFTEC material within the first plurality of openings, forming a second plurality of openings substantially adjacent to the first plurality of openings through the first surface of the substrate, and then forming an n-type TFTEC material within the second plurality of openings.

10 Claims, 6 Drawing Sheets

FORMING A THIN FILM ELECTRIC COOLER AND STRUCTURES FORMED THEREBY

CROSS-REFERENCE TO RELATED APPLICATIONS

This application is a continuation application of Ser. No. 11/296,959 filed Dec. 7, 2005, now U.S. Pat. No. 7,833,816, entitled "FORMING A THIN FILM THERMOELECTRIC COOLER AND STRUCTURES FORMED THEREBY".

BACKGROUND OF THE INVENTION

As microelectronic devices incorporate increasingly dense integrated circuit designs, higher operating speeds and higher power demands have led to successive generations of microelectronic devices requiring more effective cooling solutions. One proposed solution to cooling such microelectronic devices is by using thin film thermoelectric coolers (TFTEC). TFTECs generally contain dissimilar materials, which, when subjected to a current, may be used to effectively cool a microelectronic device.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
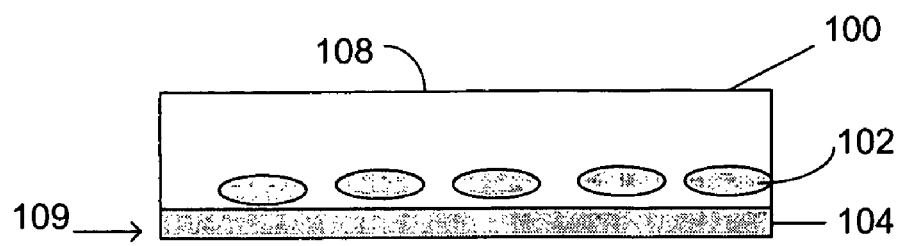
FIGS. 1a-1f represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a TFTEC structure, are described. Those methods may comprise forming a first plurality of openings through a first surface of a substrate, forming a p-type TFTEC material within the first plurality of openings, forming a second plurality of openings substantially adjacent to the first plurality of openings through the first surface of the substrate, and then forming an n-type TFTEC material within the second plurality of openings. In some embodiments, the various TFTEC structures of the present invention may be placed adjacent to, or corresponding to, a hot spot within a microelectronic device, and may function to concentrate a large amount of cooling capacity in close proximity to the hot spot.

FIGS. 1a-1f illustrate an embodiment of a method of forming a microelectronic structure, such as a TFTEC structure, for example. FIG. 1a illustrates a substrate 100. In one embodiment, the substrate 100 may be comprised of materials such as, but not limited to, silicon, silicon-on-insulator, silicon on diamond, or combinations thereof. The substrate may comprise a first surface 108, and a second surface 109. In some embodiments, the second surface 109 of the substrate 100 may comprise a device layer 104, which may comprise, in some embodiments, at least one circuit element such as but not limited to a transistor, resistor, inductor, capacitor, a dielectric layer and interconnection structures, such as bonding pads and/or bumps, for example. In one embodiment, the substrate 100 may be any such substrate that may be associated with a microelectronic device.

Figure 1B:
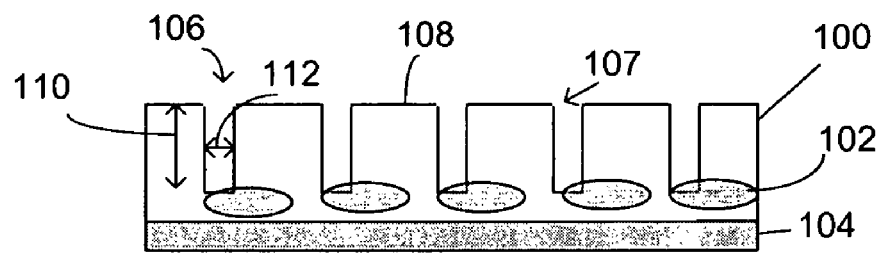

In one embodiment, the substrate 100 may further comprise a buried electrode 102. In one embodiment, the buried electrode 102 may comprise a doped area of the substrate 100. The doping of the buried electrode 102 in some embodiments may comprise a p-type material and/or an n-type material, as are well known in the art, depending upon the particular application. In one embodiment, a first plurality of openings 106 may be formed through the first surface 108 of the substrate 100 (FIG. 1b). In one embodiment, at least one of the first plurality of openings 106 may comprises a depth 110 of about 50 microns to about 200 microns. In one embodiment, the first surface 108 of the substrate 100 and a top portion 107 of the first plurality of openings 106 may be substantially co-planar. In other words, the top portion 107 of the first plurality of openings 106 and the first surface 108 of the substrate 100 may be substantially flush with one another.

At least one of the first plurality of openings 106 may comprise a width 112 of about 50 microns to about 200 microns. In one embodiment, the ratio of the depth 110 to the width 112 may be greater than about 3:1. In other words, the aspect ratio of at least one of the first plurality of openings may be greater than about 3:1. In one embodiment, at least one of the first plurality of openings 106 may be formed through an etching process, such as, by illustration and not limitation, a reactive ion etching process. In one embodiment, any type of etching and/or removal process that may form openings with aspect ratios greater than about 3:1 may be suitable for forming the first plurality of openings 106.

Figure 1C:
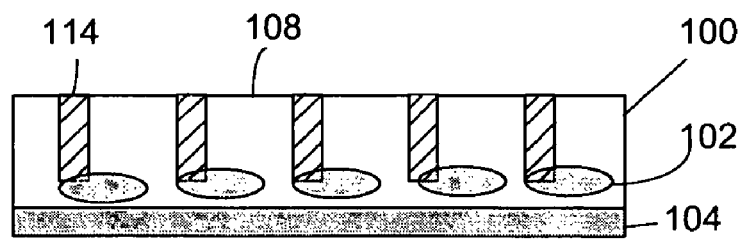

In one embodiment, a p-type TFTEC material 114 may be formed within the first plurality of openings 106 (FIG. 1c). In one embodiment, the p-type TFTEC material 114 may be formed by any formation method, for example, by illustration and not limitation, a sputtering process may be utilized, as is well known in the art. In one embodiment, the p-type TFTEC material 114 may comprise any type of p-type TFTEC material as is well known in the art. In general, a TFTEC material may comprise a material that, when electrically coupled to another TFTEC material that is of an opposite doping type, (such as, for example, a p-type TFTEC material coupled to an n-type TFTEC material) may exhibit a temperature decrease at a junction between the dissimilar TFTEC materials when a current is passed through them.

The p-type TFEC material 114 may include, in embodiments, numerous different compositions that may be doped with a p-type dopant. For example, bismuth telluride may be used as the p-type TFEC material 114, as its capacity for pumping heat can be adjusted, and the dopant concentration within the material can be controlled depending upon the application. In one embodiment, the p-type TFTEC material 114 may comprise bismuth, tellurium, selenium, germanium, antimony and silicon, and combinations thereof. For example, the p-type TFTEC material 114 may comprise bismuth telluride, and may be doped with a p-type dopant, such as germanium.

Figure 1D:
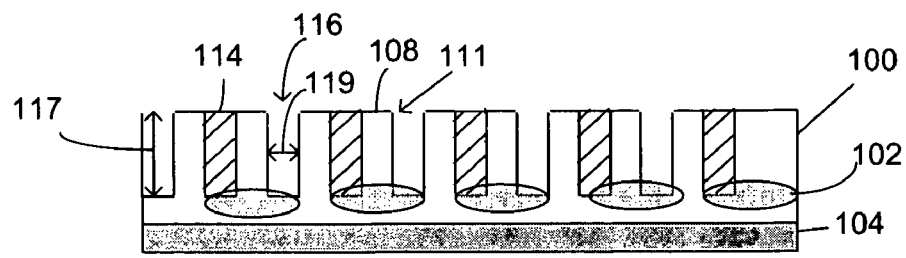

In one embodiment, a second plurality of openings 116 may be formed through the first surface 108 of the substrate 100 (FIG. 1d). In one embodiment, the second plurality of openings 116 may be formed substantially adjacent to the first plurality of openings 106. In one embodiment, the first surface 108 of the substrate 100 and a top portion 111 of the second plurality of openings 116 may be substantially coplanar. In other words, the top portion 111 of the first plurality of openings 106 and the first surface 108 of the substrate 100 may be substantially flush with one another. In one embodiment, at least one of the second plurality of openings 116 may comprises a depth 117 of about 50 microns to about 200 microns, and a width 119 of about 50 microns to about 200 microns. In one embodiment, the ratio of the depth 117 to the width 119 may be greater than about 3:1. In one embodiment, at least one of the second plurality of openings 116 may be formed through an etching process, such as, by illustration and not limitation, a reactive ion etching process.

Figure 1E:
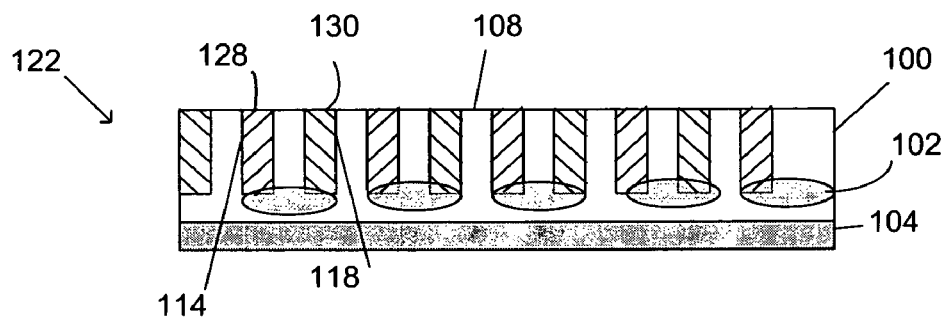

In one embodiment, an n-type TFTEC material 118 may be formed within the second plurality of openings 116 (FIG. 1e). In one embodiment, the n-type TFTEC material 118 may comprise any type of n-type TFTEC material as is well known in the art. The n-type TFEC material 118 may include, in embodiments, numerous different compositions that may be doped with a n-type dopant. For example, bismuth telluride may be used as the n-type TFEC material 118 and may be doped with an n-type dopant, such as antimony. In another embodiment, the n-type TFTEC material 118 may comprise bismuth, tellurium, selenium, germanium, antimony and silicon, and combinations thereof.

Figure 1F:
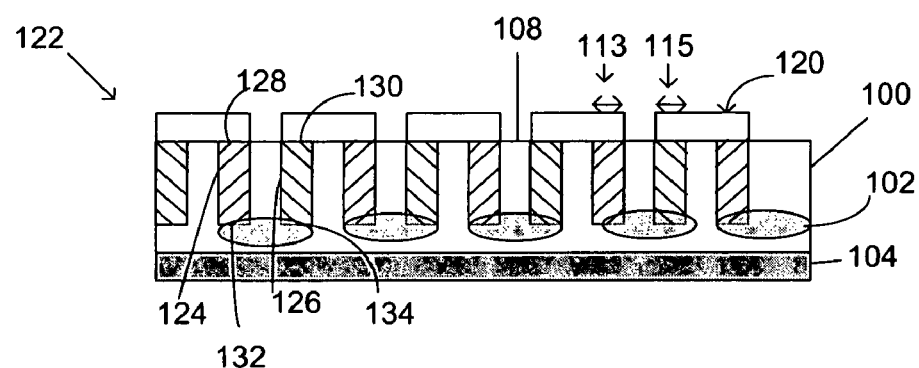

Thus, by filling the first and the second plurality of openings, 106, 116 with the p-type TFTEC material 114 and the n-type TFTEC material 118, a TFTEC structure 122 may be formed comprising a plurality of p-type TFTEC legs 124 and a plurality of n-type TFTEC legs 126 (FIG. 1f). In one embodiment, a width 113 of the plurality of p-type TFTEC legs 124 and a width 115 of the plurality of n-type TFTEC legs 126 may comprise a range from about 50 to about 200 microns. In one embodiment, the width 113 of the plurality of p-type TFTEC legs 124 may be different (for example, substantially wider or thinner) than the width 115 of the plurality of n-type TFTEC legs 126. In one embodiment, a top surface 128 of the plurality of p-type TFTEC legs 124, a top surface 130 of the plurality of n-type TFTEC legs 126 and the first surface 108 of the substrate 100 may be substantially coplanar. In one embodiment, at least one conductive trace 120 may be formed on the top surface 128 of at least one of the plurality of p-type TFTEC legs 124 and on the top surface 130 of at least one of the plurality of n-type TFTEC legs 126 (FIG. 1f). Thus at least one of the plurality of p-type TFTEC legs 124 and at least one of the plurality of n-type TFTEC legs 126 may be electrically coupled to one another.

In one embodiment, at least one of the at least one buried electrodes 102 may be disposed on a bottom surface 132 of at least one of the plurality of p-type TFTEC legs 124 and a bottom surface 134 of at least one of the plurality of n-type TFTEC legs 126. Thus at least one of the plurality of p-type TFTEC legs 124 and at least one of the plurality of n-type TFTEC legs 126 may be electrically coupled to one another on a bottom surface 132, 134 to the at least one buried electrode 102.

Because the compositions of the plurality of p-type TFTEC legs 124 and the plurality of n-type TFTEC legs 126 are dissimilar, the TFTEC structure 122 may exhibit a temperature decrease or increase at a junction between an electrically coupled n-type TFTEC leg and p-type TFTEC leg, depending upon the direction of a current that may be passed between them. For example, in one embodiment, one of the plurality of p-type TFTEC legs 124 and one of the plurality of n-type TFTEC legs 126 may be electrically coupled in series. An electrical current may be applied so that it passes from the p-type TFTEC leg to the n-type TFTEC leg. In such a case the temperature at the junction between the p-type TFTEC leg and the n-type TFTEC leg may decrease. Conversely, in another embodiment, when the current may be passed from the n-type TFTEC leg to the p-type TFTEC leg (in the opposite direction of the previous example), the temperature may increase at the junction between the pair.

Thus, in one embodiment, when at least one p-type TFTEC leg 124 and n-type TFTEC leg 126 pair may be electrically coupled in series, there may be formed a hot side and a cold side between the electrically coupled pairs within the TFTEC structure 122. In one embodiment, electronic coupling within the TFTEC structure 122 may optimized such that when placed adjacent to a heat generating device, such as a microelectronic device, the TFTEC structure 122 may carry away heat from a hot spot within the heat generating device. In this manner, the TFEC structure 122 may act as a heat pumping structure. As described here, a hot spot is a portion of a device exhibiting a higher temperature than other areas of the device.

In one embodiment, a passive or active cooling device (not shown) may be placed adjacent to the hot side of the TFTEC structure 122 for removal from the device or system. In one embodiment, the greater the number of p-type TFTEC leg 124 and n-type TFTEC leg 126 pairs that may be electrically coupled in series, the greater will be the overall heat carrying capacity of the TFTEC structure 122.

It will be understood by those skilled in the art that the p-type TFTEC legs 124 and n-type TFTEC legs 126 of the TFTEC structure 122 may be coupled in various arrangements, such as in series and/or in parallel, depending upon the particular application. In one embodiment, the TFTEC structure 122 may function to concentrate a large amount of cooling capacity in close proximity to a hot spot that may be located within the device layer 104.

Figure 2A:
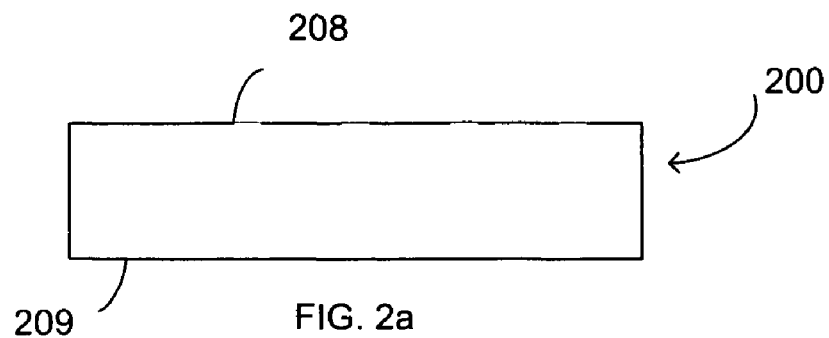
FIGS. 2a-2h represent methods of forming structures according to another embodiment of the present invention.

FIGS. 2a-2f depict another embodiment of a method of forming a microelectronic structure, such as a TFTEC structure, for example. FIG. 2a illustrates a substrate 200. In one embodiment, the substrate 100 may be comprised of materials such as, but not limited to, silicon, silicon-on-insulator, silicon on diamond, or combinations thereof. The substrate may comprise a first surface 208, and a second surface 209. In one embodiment, the substrate 100 may be any such substrate that may be associated with a microelectronic device.

Figure 2B:
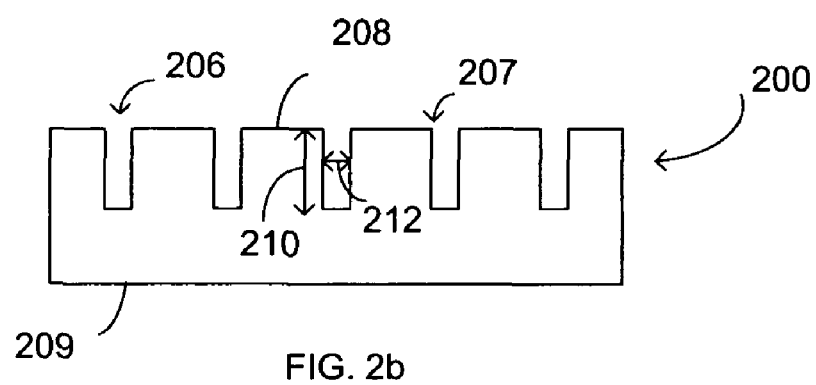

In one embodiment, a first plurality of openings 206 may be formed through the first surface 208 of the substrate 200 (FIG. 2b). In one embodiment, at least one of the first plurality of openings 206 may comprises a depth 210 of about 50 microns to about 200 microns. In one embodiment, the first surface 208 of the substrate 200 and a top portion 207 of the first plurality of openings 206 may be substantially co-planar.

Figure 2C:
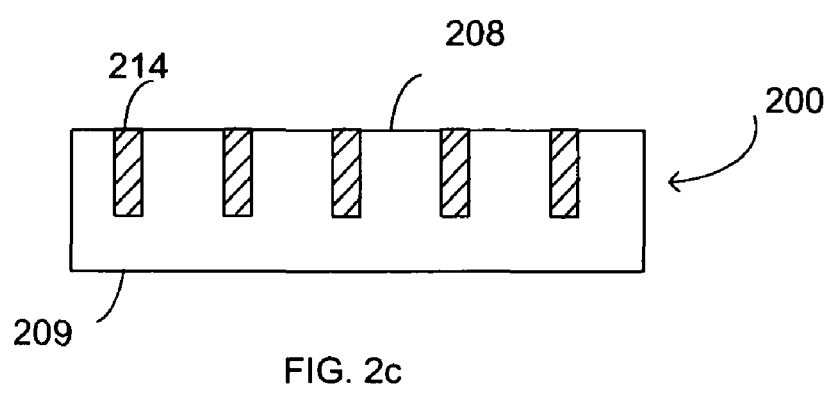

At least one of the first plurality of openings 206 may comprise a width 212 of about 50 microns to about 200 microns. In one embodiment, the ratio of the depth 210 to the width 212 may be greater than about 3:1. In one embodiment, a p-type TFTEC material 214 may be formed within the first plurality of openings 206 (FIG. 2c). In one embodiment, the p-type TFTEC material 214 may comprise any type of p-type TFTEC material as is well known in the art. In one embodiment, the p-type TFTEC material 114 may comprise bismuth, tellurium, selenium, germanium, antimony and silicon, and combinations thereof.

Figure 2D:
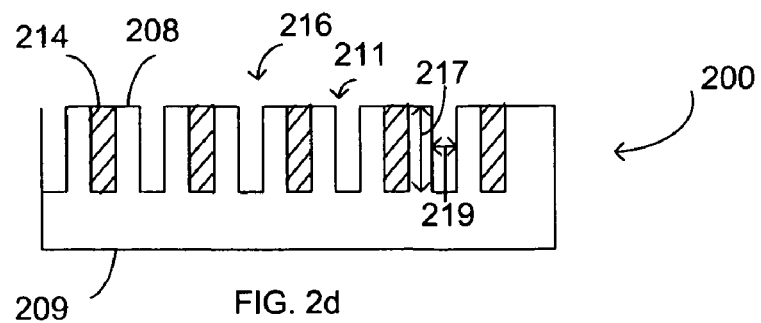

In one embodiment, a second plurality of openings 216 may be formed through the first surface 208 of the substrate 200 (FIG. 2d). In one embodiment, the first surface 208 of the substrate 200 and a top portion 211 of the second plurality of openings 216 may be substantially co-planar. In one embodiment, at least one of the second plurality of openings 216 may comprise a depth 217 of about 50 microns to about 200 microns, and a width 219 of about 50 microns to about 200 microns. In one embodiment, the ratio of the depth 217 to the width 219 may be greater than about 3:1.

Figure 2E:
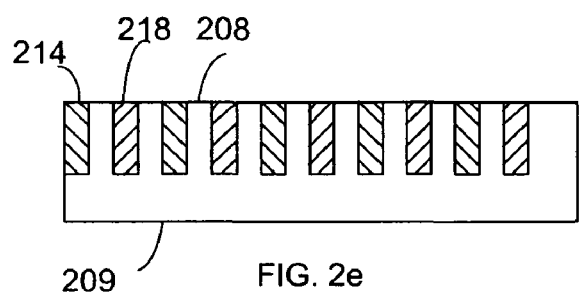

In one embodiment, an n-type TFTEC material 218 may be formed within the second plurality of openings 216 (FIG. 2e). In one embodiment, the n-type TFTEC material 218 may comprise any type of n-type TFTEC material as is well known in the art. In another embodiment, the n-type TFTEC material 218 may comprise bismuth, tellurium, selenium, germanium, antimony and silicon, and combinations thereof.

Figure 2F:
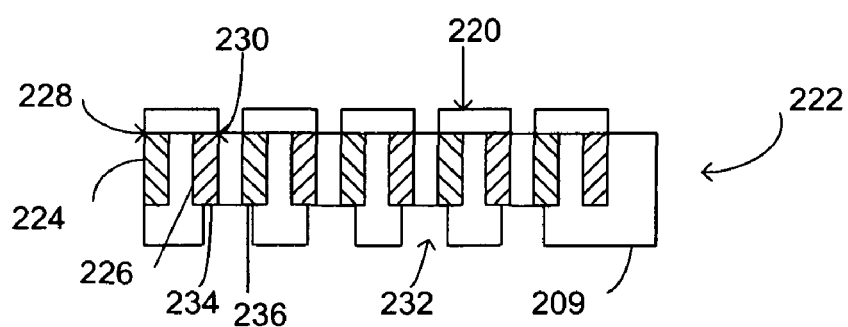

Thus, by filling the first and the second plurality of openings, 206, 216 with the p-type TFTEC material 214 and the n-type TFTEC material 218, a TFTEC structure 222 may be formed comprising a plurality of p-type TFTEC legs 224 and a plurality of n-type TFTEC legs 226 (FIG. 2f). In one embodiment, a top surface 228 of the plurality of p-type TFTEC legs 224, a top surface 230 of the plurality of n-type TFTEC legs 226 and the first surface 208 of the substrate 200 may be substantially co-planar. In one embodiment, at least one conductive trace 220 may be formed on the top surface 228 of at least one of the plurality of p-type TFTEC legs 224 and on the top surface 230 of at least one of the plurality of n-type TFTEC legs 226. Thus, at least one of the plurality of p-type TFTEC legs 224 and at least one of the plurality of n-type TFTEC legs 226 may be electrically coupled to one another.

Figure 2G:
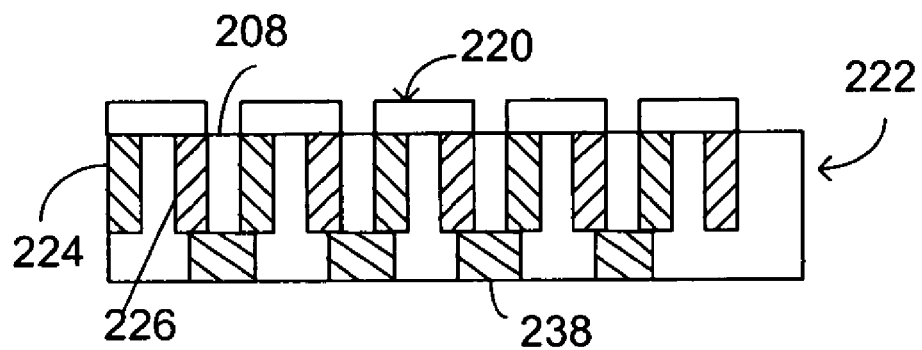
Figure 2H:
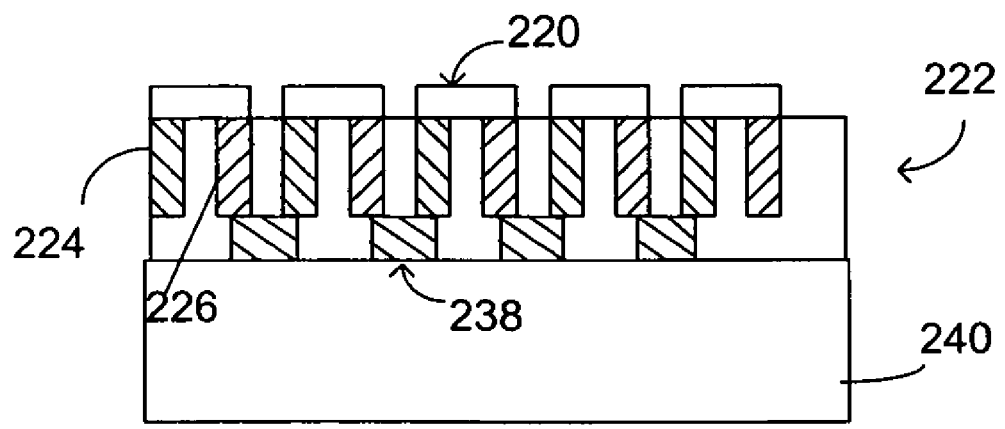

In one embodiment, a third plurality of openings 232 may be formed through the second side 209 of the substrate, wherein at least one of the third plurality of openings 232 may expose a bottom surface 234 of at least one of the plurality of n-type TFTEC legs 226 and a bottom surface 236 of at least one of the plurality of p-type TFTEC legs 224. In one embodiment, a conductive material 238 may be formed within the third plurality of openings 232, wherein the conductive material 238 may electrically couple at least one of the plurality of p-type TFTEC legs 124 and one the n-type TFTEC legs 126 together (FIG. 2g). In one embodiment, the TFTEC structure 222 may be attached and/or electrically coupled to a device 240, such as a microelectronic device, for example (FIG. 2h). In one embodiment, the TFTEC structure 222 may function as a cooling apparatus for the device 240, similar to the cooling function of the TFTEC structure 122 of FIG. 1f, for example.

Figure 3:
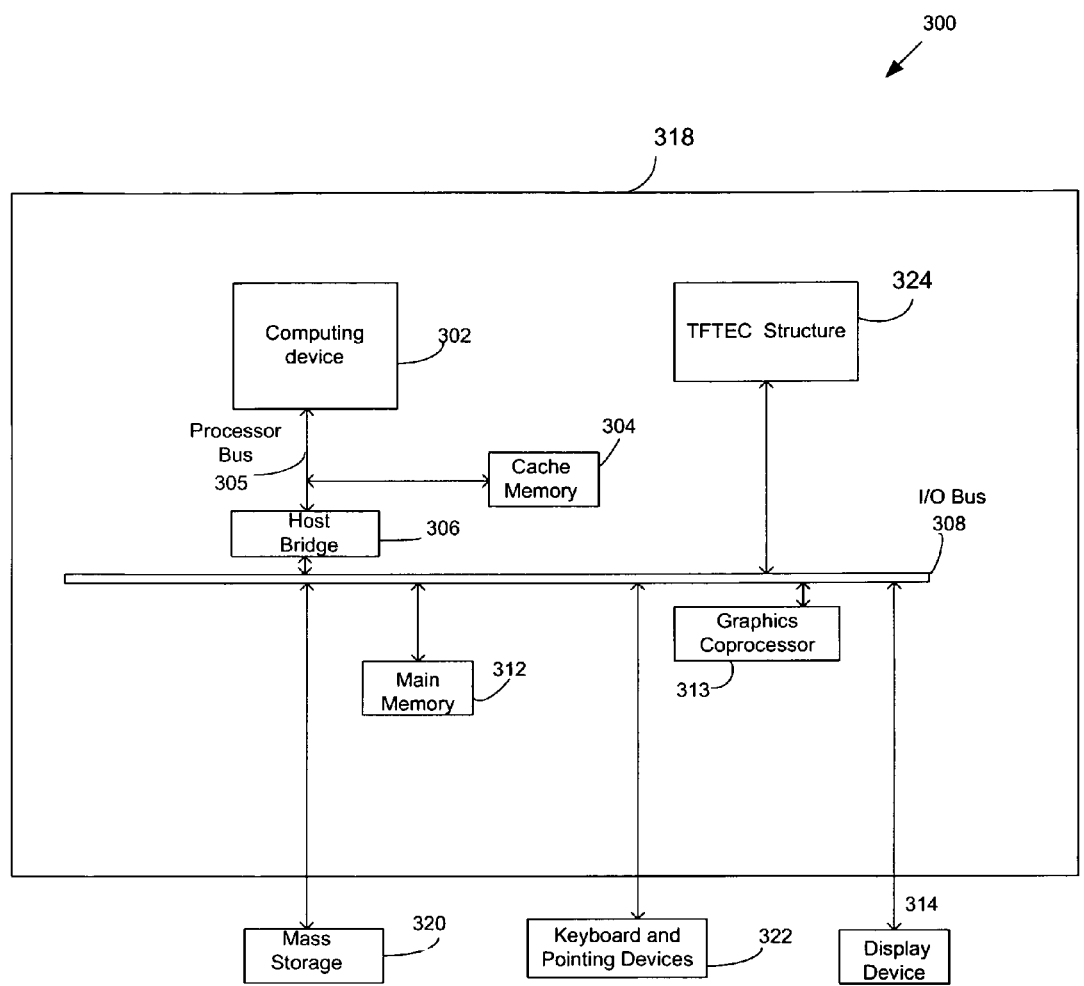
FIG. 3 represents a system according to another embodiment of the present invention.

FIG. 3 is a diagram illustrating an exemplary system 300 capable of being operated with methods for fabricating a microelectronic structure, such as the TFTEC structure 122 of FIG. 1f, for example. It will be understood that the present embodiment is but one of many possible systems in which the substrate core structures of the present invention may be used.

In the system 300, the TFTEC structure 324 may be communicatively coupled to a printed circuit board (PCB) 318 by way of an I/O bus 308. The communicative coupling of the TFTEC structure 324 may be established by physical means, such as through the use of a package and/or a socket connection to mount the TFTEC structure 324 (and any associated/attached microelectronic device) to the PCB 318 (for example by the use of a chip package, interposer and/or a land grid array socket). The TFTEC structure 324 may also be communicatively coupled to the PCB 318 through various wireless means (for example, without the use of a physical connection to the PCB), as are well known in the art.

The system 300 may include a computing device 302, such as a processor, and a cache memory 304 communicatively coupled to each other through a processor bus 305. The processor bus 305 and the I/O bus 308 may be bridged by a host bridge 306. Communicatively coupled to the I/O bus 308 and also to the TFTEC structure 324 may be a main memory 312. Examples of the main memory 312 may include, but are not limited to, static random access memory (SRAM) and/or dynamic random access memory (DRAM), and/or some other state preserving mediums. The system 300 may also include a graphics coprocessor 313, however incorporation of the graphics coprocessor 313 into the system 300 is not necessary to the operation of the system 300. Coupled to the I/O bus 308 may also, for example, be a display device 314, a mass storage device 320, and keyboard and pointing devices 322.

These elements perform their conventional functions well known in the art. In particular, mass storage 320 may be used to provide long-term storage for the executable instructions for a method for forming and/or utilizing TFTEC structures in accordance with embodiments of the present invention, whereas main memory 312 may be used to store on a shorter term basis the executable instructions of a method for forming and/or utilizing TFTEC structures in accordance with embodiments of the present invention during execution by computing device 302. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, main memory 312 may supply the computing device 302 (which may be a processor, for example) with the executable instructions for execution.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as cooling structures, are well known in the art. Therefore, the Figures provided herein illustrate only portions of an exemplary microelectronic structure that pertains to the practice of the present invention. Thus the present invention is not limited to the structures described herein.

What is claimed is:

1. A TFTEC structure comprising:
    at least one buried electrode within a substrate, wherein the at least one buried electrode comprises one of a p doped and an n doped silicon region of the substrate;
    a plurality of p-type TFTEC legs that are disposed through a first surface of the substrate, and a plurality of n-type TFTEC legs substantially adjacent to the first plurality of p-type TFTEC legs disposed through the first surface of the substrate.

2. The structure of claim 1 wherein at least one of the plurality of p-type TFTEC legs and the plurality of n-type TFTEC legs comprises a depth of about 50 microns to about 200 microns.

3. The structure of claim 1 wherein a second surface of the substrate comprises a device layer.

4. The structure of claim 1 wherein at least one of the p-type TFTEC legs and the n-type TFTEC legs comprises at least one of bismuth, tellurium, selenium, germanium, antimony and silicon, and combinations thereof.

5. The structure of claim 1 wherein a conductive material is disposed on at least one of a top surface of the p type TFTEC leg and a top surface of the n-type TFTEC leg.

6. The structure of claim 1 wherein the at least one buried electrode is disposed on a bottom surface of at least one of the p type TFTEC legs and a bottom surface of at least one of the n-type TFTEC legs.

7. The structure of claim 1 wherein a top surface of at least one of the p-type TFTEC legs and a top surface of at least one of the n-type TFTEC legs are electrically coupled together.

8. The structure of claim 1 wherein at least one of the p-type TFTEC legs and at least one of the n-type TFTEC legs comprise a ratio of a depth to a width of the legs that is greater than about 3:1.

9. The structure of claim 1 further comprising a conductive material disposed on a bottom surface of at least one of the p-type TFTEC legs and on a bottom surface of at least one of the n-type TFTEC legs.

10. The structure of claim 1 wherein a first surface of the substrate and a top surface of the plurality of p-type TFTEC legs and a top surface of the plurality of n-type TFTEC legs are substantially co-planar.

* * * * *